United States Patent
Byeon et al.

(10) Patent No.: US 7,397,706 B2
(45) Date of Patent: Jul. 8, 2008

(54) METHODS OF ERASING FLASH MEMORY DEVICES BY APPLYING WORDLINE BIAS VOLTAGES HAVING MULTIPLE LEVELS AND RELATED FLASH MEMORY DEVICES

(75) Inventors: Dae-Seok Byeon, Yongin-si (KR); Young-Ho Lim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/381,556

(22) Filed: May 4, 2006

(65) Prior Publication Data
US 2006/0279999 A1    Dec. 14, 2006

(30) Foreign Application Priority Data
Jun. 13, 2005    (KR) .................. 10-2005-0050471

(51) Int. Cl.
*G11C 16/04* (2006.01)
*G11C 16/06* (2006.01)

(52) U.S. Cl. ................... 365/185.29; 365/185.23; 365/185.27; 365/185.33

(58) Field of Classification Search ............ 365/185.29
See application file for complete search history.

(56) References Cited

U.S. PATENT DOCUMENTS

| 5,270,980 | A | | 12/1993 | Pathak et al. | |
|---|---|---|---|---|---|
| 5,406,521 | A | * | 4/1995 | Hara ..................... | 365/185.25 |
| 5,532,971 | A | * | 7/1996 | Tanaka et al. .......... | 365/230.06 |
| 5,917,757 | A | * | 6/1999 | Lee et al. ............... | 365/185.33 |
| 6,160,739 | A | * | 12/2000 | Wong ..................... | 365/185.29 |
| 6,160,740 | A | * | 12/2000 | Cleveland .............. | 365/185.29 |
| 6,359,810 | B1 | * | 3/2002 | Gupta et al. ............ | 365/185.29 |
| 6,407,947 | B2 | | 6/2002 | Ahn et al. | |
| 6,507,522 | B2 | * | 1/2003 | Lee et al. ................ | 365/185.3 |
| 6,594,178 | B2 | | 7/2003 | Choi et al. | |
| 6,618,292 | B2 | | 9/2003 | Sakui | |
| 6,807,103 | B2 | * | 10/2004 | Cavaleri et al. ........ | 365/185.23 |

(Continued)

FOREIGN PATENT DOCUMENTS

JP    2002-025283    1/2002

(Continued)

OTHER PUBLICATIONS

Notice to File a Response/Amendment to the Examination Report for Korean Patent Application No. 2005-50471; date of mailing Feb. 8, 2007.

(Continued)

*Primary Examiner*—Son L. Mai
(74) *Attorney, Agent, or Firm*—Myers Bigel Sibley & Sajovec

(57) ABSTRACT

Methods of erasing data in a flash memory device are provided in which a plurality of wordline bias voltages are generated that include wordline bias voltages having at least two different levels, erasing data by applying the different wordline bias voltages to respective ones of a plurality of wordlines while applying an erasing voltage to a bulk region of memory cells, and verifying the erased states of the memory cells. Pursuant to these methods, the spread of the threshold-voltage distribution profile that may result from deviations of erasure-coupling ratios between memory cells may be reduced.

33 Claims, 5 Drawing Sheets

U.S. PATENT DOCUMENTS

| | | | |
|---|---|---|---|
| 6,818,491 B2 * | 11/2004 | Lee et al. | 438/200 |
| 6,853,582 B1 | 2/2005 | Matsuda et al. | |
| 6,958,936 B2 * | 10/2005 | Quader et al. | 365/185.17 |
| 2005/0232013 A1 * | 10/2005 | Kawai et al. | 365/185.18 |
| 2007/0047327 A1 * | 3/2007 | Goda et al. | 365/185.29 |

FOREIGN PATENT DOCUMENTS

| | | |
|---|---|---|
| JP | 2002-150782 | 5/2002 |
| JP | 2002-216487 | 8/2002 |
| JP | 2004-171686 A | 6/2004 |
| JP | 2005-025824 A | 1/2005 |
| KR | 2000-0044942 A | 7/2000 |
| KR | 10-2002-0001251 A | 1/2002 |
| KR | 2003-0043798 A | 3/2002 |
| KR | 10-2002-0042756 A | 6/2002 |
| KR | 10-2002-0060339 A | 7/2002 |
| KR | 2003-43798 | 6/2003 |

OTHER PUBLICATIONS

English translation of Notice to File a Response/Amendment to the Examination Report for Korean Patent Application No. 2005-50471; date of mailing Feb. 8, 2007.

* cited by examiner

Va ≠ Vb

{ WLr : reference-speed cell
  WLi : low-speed cell
  WLj : high-speed cell $V_0 \neq V_1 \neq \cdots \neq V_{31}$

METHODS OF ERASING FLASH MEMORY DEVICES BY APPLYING WORDLINE BIAS VOLTAGES HAVING MULTIPLE LEVELS AND RELATED FLASH MEMORY DEVICES

CROSS-REFERENCE TO RELATED APPLICATIONS

This application claims priority under 35 U.S.C. § 119 from Korean Patent Application No. 2005-50471, filed on Jun. 13, 2005, the disclosure of which is hereby incorporated by reference herein as if set forth in its entirety.

FIELD OF THE INVENTION

The present application relates to flash memory devices and, more particularly, to methods of erasing flash memory devices.

BACKGROUND

Flash memory devices are a well known type of semiconductor memory device. In a programming mode, charges are stored via tunneling in a floating gate of a flash memory device to store data in the flash memory device. In an erasing mode, charges are discharged from the floating gate. Flash memory devices may have high integration density, low power consumption, and strong endurance against external shocks or stresses. As a result, they are increasingly used in various applications such as in mobile electronic devices.

FIG. 1 is a cross-sectional diagram showing cell bias voltages for an erasing operation in a flash memory cell. As shown in FIG. 1, the flash memory cell includes a control gate (CG) 10, a floating gate (FG) 20, a source region 30a, a drain region 30b, and a P-well 40 that forms a channel in a bulk region of the device. An oxide/nitride/oxide (ONO) dielectric film that may have a large coupling capacitance is provided between the control gate 10 and the floating gate 20. A tunnel oxide film is interposed between the floating gate 20 and the P-well 40 to facilitate Fowler-Nordheim tunneling (F-N tunneling). Thus, as shown in FIG. 1, there is capacitance $C_1$ through the dielectric film between the control gate 10 and the floating gate 20, and there is tunnel capacitance $C_2$ through the tunnel oxide film between the floating gate 20 and the P-well 40. Through the selection of the capacitances $C_1$ and $C_2$, it is possible to divide bias voltages for programming, erasing, and reading voltages. In erasing data from the flash memory cell, a wordline voltage $V_{WL}$ of, for example, about 0V is applied to the control gate 10, while an erasing voltage $V_{era}$ of, for example, about 20V is applied to the bulk region 40. Under this bias condition, electrons move from the floating gate 20 toward the P-well 40 through the tunnel oxide film by way of the F-N tunneling effect induced by a DC voltage distributed at the tunnel capacitance $C_2$. Table 1 below summarizes a bias condition of voltages applied to a memory cell block (herein the term "block" may comprise any grouping of memory cells such as, for example, any block, sector or array of memory cells) during such an erasing operation.

TABLE 1

| | |
|---|---|
| Wordline (WL) | 0 |
| Selected transistor (SSL/GSL) | F |
| Common source line (CSL) | F |
| Bitline (BL) | F |
| P-well (bulk region) | $V_{era}$ |

In Table 1, the symbol 'F' means a floating state. Under the bias condition shown in the Table 1, the migration of electrons from the floating gate 20 to the P-well 40 by the tunneling effect is dependent on a tunneling voltage $V_{tun}$ that is distributed between the P-well 40 and the floating gate 20. The tunneling voltage $V_{tun}$ is determined by the capacitance $C_1$ between the control gate 10 and the floating gate 20, and the tunnel capacitance $C_2$ between the floating gate 20 and the P-well 40. The tunnel capacitance $C_2$ is the sum of all capacitive factors between layers in adjacent floating gates and the bulk region of the device. An erasure-coupling ratio $\alpha_{era}$, which is a factor representing a ratio of voltages contributing to the tunneling effect during the erasing operation, is given by Equation 1.

$$\alpha_{era} = \frac{C_2}{C_1 + C_2} \quad \text{[Equation 1]}$$

The potential of the floating gate ($V_{FG}$) is a function of the erasure-coupling ratio as shown in Equation 2.

$$V_{FG} = (V_{era} - V_{WL}) \times \alpha_{era} \quad \text{[Equation 2]}$$

The tunneling voltage $V_{tun}$ is distributed in the dimension set by subtracting the potential $V_{FG}$ from the erasing voltage $V_{era}$ that is applied to the bulk region or P-well 40, as shown in Equation 3.

$$V_{tun} = (V_{era} - V_{FG}) \quad \text{[Equation 3]}$$

If the erasure-coupling ratio $\alpha_{era}$ is uniform over all of the memory cells in a unit block, electrons are uniformly discharged from the floating gate by the equivalent distribution with the same tunneling voltage $V_{tun}$ according to the same erasing voltage under the bias conditions shown in Table 1. Thus, the memory cells after the erasing operation may have a narrow threshold-voltage distribution profile. However, the erasure-coupling ratio $\alpha_{era}$ may be variable across memory cells in a unit block because of, for example, irregular wordline widths and pitches due to variations in wordline patterns and/or processing conditions. These variations in the erasure-coupling ratio may result in different threshold voltages, after the erasing operation, by memory cells or unit pages each sharing the same wordline. The deviations in the erasure-coupling ratio $\alpha_{era}$ may thus generate a widely spread distribution profile of threshold voltages over the memory device.

FIG. 2 is a graph depicting the threshold-voltage distribution profile, after the erasing operation, that may result due to deviations in the erasure-coupling ratios by memory cells or pages. In particular, FIG. 2 shows a threshold-voltage distribution profile 100 of the programmed state for general flash memory cells, and the post-erasing threshold-voltage distribution profile 110, 120, 130 of the memory cells in a flash memory device.

As shown in FIG. 2, the threshold-voltage distribution pattern after the erasing operation under the bias condition shown in Table 1 exhibits a wider distribution profile 110, 120, 130 as compared to the programming distribution profile 100. This wider threshold-voltage distribution profile arises because of the variations between the erasure-coupling ratios, which results in differences in the erasure speeds of the memory cells. In particular, there are over-erased cells that are located in the distribution profile 130 under a preferred lower limit $V_{oe}$ (i.e., lower than the proper post-erasing distribution profile 120, and under-erased cells 110, which are located in the distribution profile 110 over the preferred upper limit $V_{de}$ (i.e., higher than the proper post-erasing distribution profile 120, due to inefficient tunneling effects by small tunneling voltages. The over-erased cells are referred to as fast-erased cells, while the under-erased cells are referred to as slow-erased cells. The fast-erased and slow-erased cells result in the wider threshold-voltage distribution profile, even though the same erasing voltage $V_{era}$ is applied to the memory cells. The slow-erased cells have small erasure-coupling ratios ($\alpha_{era}$), and hence relatively lower voltages for the tunneling effect. As a result, it takes a longer period of time for sufficient electrons to be released from the floating gates 20 to the P-well 40 (for the same erasing voltage $V_{era}$) as compared to other memory cells. In the fast-erased cells, the erasure-coupling ratios ($\alpha_{era}$) are larger than other cells in the same block or sector, and hence electrons are more easily released (for the same erasing voltage $V_{era}$) from the floating gates 20 to the P-well 40. The spread of the post-erasing threshold-voltage distribution profile means that the speed with which the memory cells are erased differs.

SUMMARY

Pursuant to embodiments of the present invention, methods for erasing memory cells of a flash memory device having at least first and second wordlines are provided in which a first electric field is applied between a bulk region of the flash memory device and the first wordline, and a second electric field (that is different from the first electric field) is applied between the bulk region and the second wordline. In these methods, an erasing voltage may also be applied to the bulk region. The first wordline may be supplied with a first voltage and the second wordline may be supplied with a second voltage that is different from the first voltage. The first electric field may be induced from the voltage difference between the first wordline and the bulk region, and the second electric field may be induced from the voltage difference between the second wordline and the bulk region.

In these methods, the first and second electric fields may be arranged to reduce differences in erasing speeds between memory cells connected to the first and second wordlines. The first wordline may be connected to memory cells having fast erasing speeds and the second wordline may be connected to memory cells having slow erasing speeds. In such embodiments, the first voltage may be greater than the second voltage.

In certain embodiments, these methods may further include obtaining data regarding the erasing speeds of the memory cells and selecting the first voltage and the second voltage based on the obtained data. The flash memory device may also include an additional plurality of wordlines. In such devices, the method may also include applying a third electric field between a bulk region of the flash memory device and at least one of the additional plurality of wordlines, where the third electric field is different from both the first electric field and the second electric field.

Pursuant to further embodiments of the present invention, methods of erasing a plurality of memory cells of a flash memory device are provided in which the plurality of memory cells are erased by applying a first voltage to a bulk region of the flash memory device and applying a plurality of wordline voltages to respective of a plurality of wordlines of the flash memory device. Then, a determination is made as to whether the memory cells are erased normally. In these methods, the plurality of wordline voltages include wordline voltages having at least two different voltage levels.

The plurality of memory cells may be erased in these methods through electric fields formed by voltage differences between the plurality of wordline voltages and the first voltage. The wordlines that are connected to memory cells having fast erasing speeds may receive wordline voltages that are higher than the wordline voltages provided to the wordlines that are connected to memory cells with slow erasing speeds. These methods may also include further erasing the plurality of memory cells if it is determined that the memory cells were not erased normally.

Pursuant to additional embodiments of the present invention, methods of erasing memory cells of a flash memory device having a plurality of wordlines are provided in which a plurality of wordline bias voltages are generated, where at least some of the wordline bias voltages are different than other of the wordline bias voltages. These wordline bias voltages are then applied to respective ones of the plurality of wordlines, and an erasing voltage is applied to a bulk region of the flash memory device to erase the memory cells. Then a determination is made regarding an erased state of the memory cells.

In these methods, the ones of the plurality of wordline bias voltages that are applied to memory cells having fast erasing speeds may be higher than the ones of the plurality of wordline bias voltages that are applied to memory cells having slow erasing speeds. At least some of the plurality of wordline bias voltages may be negative voltages. These methods may also include continuing to apply the plurality of wordline bias voltages to respective ones of the plurality of wordlines and the erasing voltage to a bulk region of the flash memory device if it is determined that the memory cells are not fully erased.

Pursuant to still further embodiments of the present invention, methods of erasing a memory cell array of a flash memory device are provided in which data regarding the erasing speeds of a plurality of memory cells in the memory cell array is obtained and a plurality of wordline bias voltages are applied to respective of a plurality of wordlines of the memory cell array during an erasing operation. In these methods, the applied wordline bias voltages may be selected based at least in part on the obtained data.

Pursuant to still further embodiments of the present invention, memory devices are provided which include a memory cell array, a plurality of wordlines coupled to the memory cell array, and a voltage generator that is configured to provide a plurality of wordline bias voltages to respective ones of the plurality of wordlines and to further provide an erasing voltage. The plurality of wordline bias voltages include voltages having at least two different voltage levels. The memory cell array may be erased when the plurality of wordline bias voltages are applied to the respective ones of the plurality of wordlines and the erasing voltage is applied to a bulk region of the memory cell array.

BRIEF DESCRIPTION OF THE FIGURES

Certain embodiments of the present invention will be described with reference to the following figures, wherein like reference numerals refer to like parts throughout the various figures unless otherwise specified. In the figures.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Figure 1:
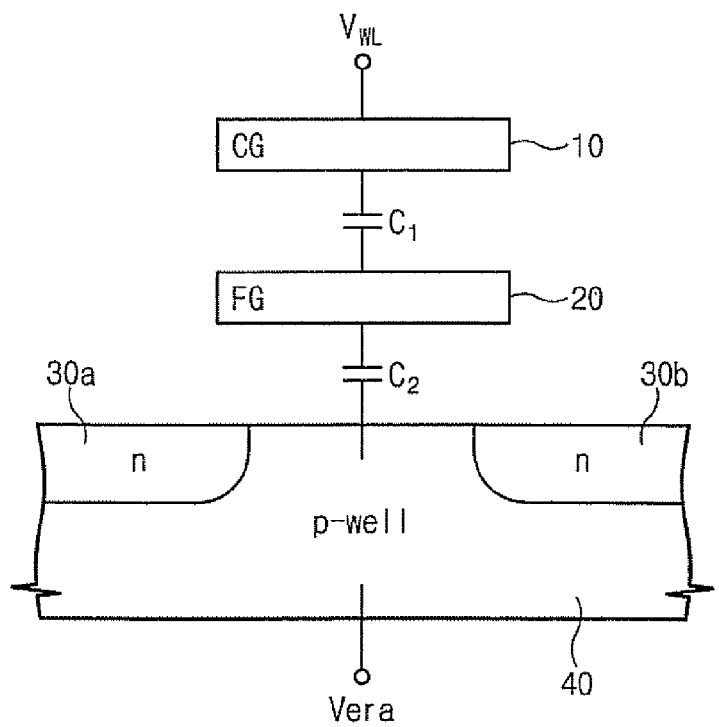
FIG. 1 is a cross-sectional diagram of a flash memory cell showing the cell bias voltages for an erasing operation.
Figure 2:
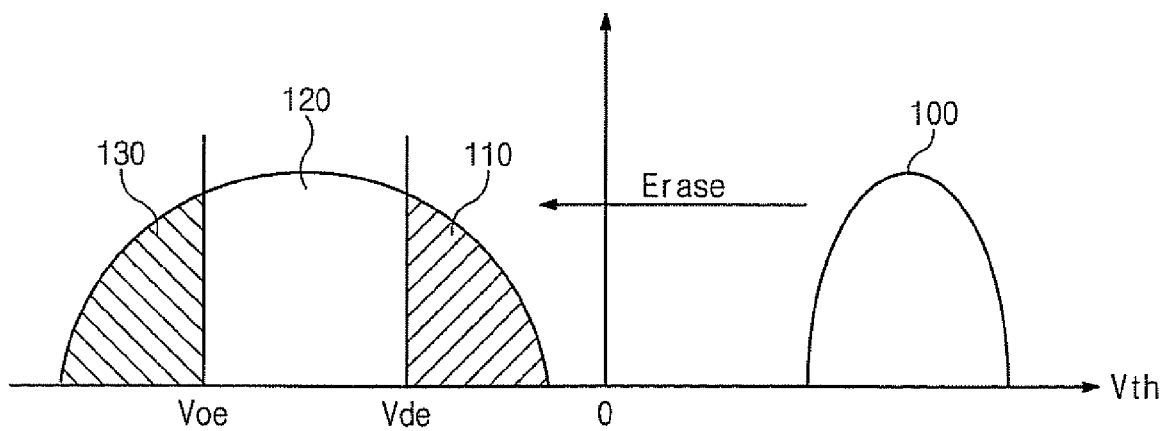
FIG. 2 is a graph depicting the differences of threshold-voltage distributions, after the erasing operation, according to the erasure coupling ratios of the memory cells.
Figure 3:
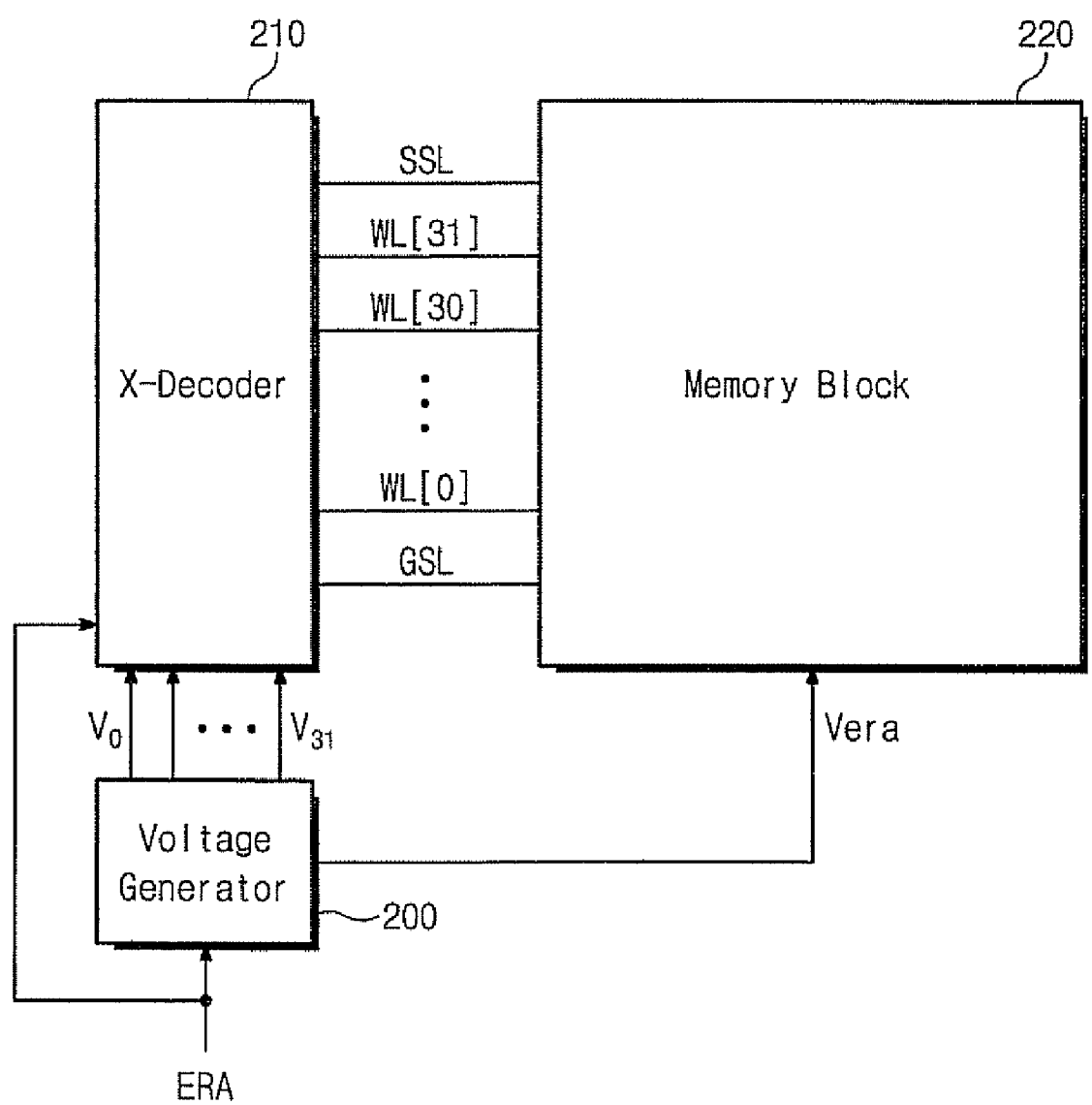
FIG. 3 is a block diagram illustrating a functional structure for applying different wordline bias voltages to wordlines of a flash memory device during the erasing operation in accordance with embodiments of the present invention.

FIG. 3 is a block diagram illustrating the functional structure of a flash memory device in accordance with certain embodiments of the present invention. The flash memory device of FIG. 3 may apply different wordline voltages to wordlines during an erasing operation. As shown in FIG. 3, the flash memory device includes a voltage generator 200 that provides wordline bias voltages $V_0$~$V_{31}$. The wordline bias voltages $V_0$~$V_{31}$ are applied to wordlines during an erasing operation. The flash memory device further includes an X-decoder (or row decoder) 210 that transfers the wordline bias voltages $V_0$~$V_{31}$ from the voltage generator 200 to the wordlines in response to an erasing command ERA. The flash memory device also includes a memory block 220 that includes a plurality of memory cells that may be erased in response to (1) an erasing voltage $V_{era}$ that is supplied from the voltage generator 200 and (2) the wordline bias voltages $V_0$~$V_{31}$ supplied through the X-decoder 210.

The voltage generator 200 outputs the wordline bias voltages $V_0$~$V_{31}$ in response to the erasing command ERA. The wordline bias voltages $V_0$~$V_{31}$ are generated based on data regarding the erasing speeds of the memory cells in the memory block 220 that is obtained through a testing step. The erasing-speed data of the memory cells may comprise numerical data that is obtained and stored during a test performed, for example, during the initial manufacturing process. During this test, a determination may be made as to whether the memory cells are erased at a fast or a slow speed as compared to a reference threshold voltage by conducting erasure-verifying operations after completing the programming and erasing operations. For example, the erasing-speed data may be obtained by applying incrementing or decrementing step voltages to wordlines, recording the pass states of the memory cells into page buffers by stages, and detecting post-erasing positions of the threshold voltages. In addition to the erasing-speed data, threshold-voltage distribution profiles may be evaluated and stored as data through the verifying operation. While the characteristics of the erasing speeds are exemplarily distinguished into fast and slow erasing speeds, it will be appreciated in light of the present disclosure that they may be further differentiated into more than three speeds to further narrow the post-erasing threshold-voltage distribution profile. In this case, the voltage generator 200 may provide wordline bias voltages $V_0$~$V_{31}$ having more than three discrete levels. As a result, the tunneling voltage $V_{tun}$ of the memory cell is operable with high resolution, enabling the post-erasing threshold-voltage distribution profile to be properly arranged. The voltage generator 200 also provides the erasing voltage $V_{era}$ that is applied to the bulk region 40 of the memory block 220 to release charges from the floating gates 20.

The X-decoder 210 transfers each of the wordline bias voltages $V_0$~$V_{31}$ from the voltage generator 200 to a respective one of the wordlines $W_0$~$W_{31}$ in response to the erasing command ERA. While the X-decoder 210 of FIG. 3 is configured to operate address selection for a single memory block, it is well known by those skilled in this art that the selection of the wordlines and the selection lines, SSL, GSL, and CSL, in the unit of page or block is carried out by decoding input address signals in response to commands.

The memory block 220 is composed of memory cells that are erasable by the erasing voltage $V_{era}$ and the wordline bias voltages $V_0$~$V_{31}$ supplied from the X-decoder 210 in response to the erasing command ERA. According to embodiments of the present invention, the memory cells may have a relatively narrow threshold-voltage distribution profile using a common erasing voltage $V_{era}$ and different wordline voltages (i.e., different control voltages). As a result, the erasing speeds of the memory cells may be more uniform.

Figure 4A:
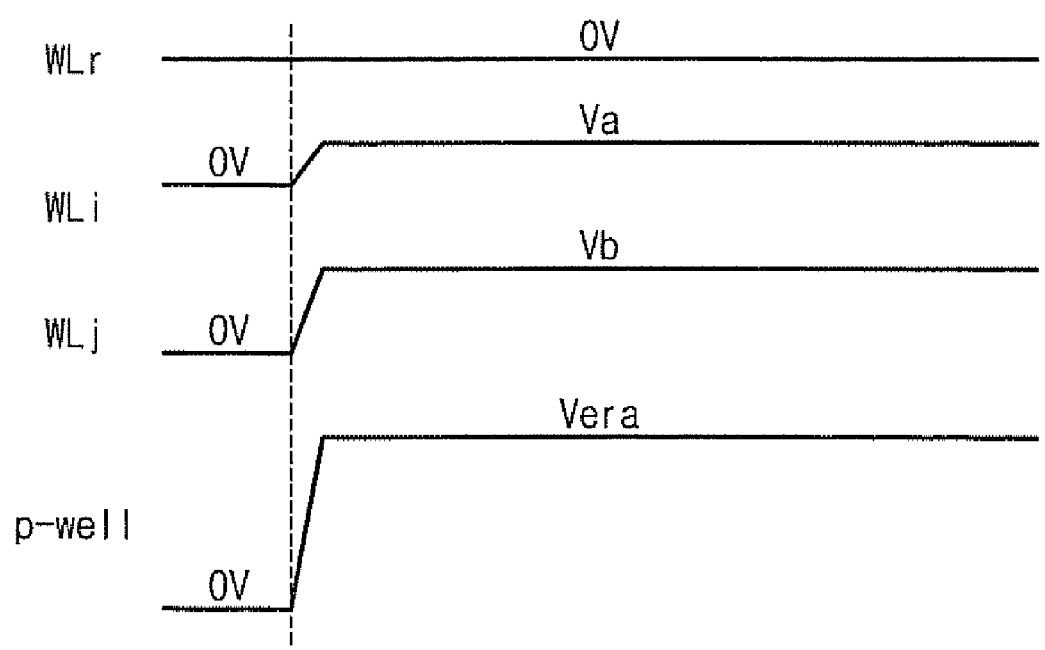
FIG. 4A is a timing diagram illustrating three exemplary levels of voltages that may be applied to the wordlines of the flash memory device of FIG. 3.

FIG. 4A is a timing diagram illustrating exemplary patterns of the wordline bias voltage in accordance with embodiments of the present invention. As shown in FIG. 4A, a wordline bias voltage of 0V maybe applied to the wordline WLr of a memory cell that has a normal erasing speed, a wordline bias voltage Va may be applied to the wordline WLi of a memory cell that has a slow erasing speed, a wordline bias voltage Vb may be applied to the wordline WLi of a memory cell that has a fast erasing speed, and an erasing voltage $V_{era}$ may be applied to the bulk region 40 of the memory block 220. As shown in FIG. 4A, in this particular embodiment in which the memory cells are differentiated into memory cells having fast, normal and slow erasing speeds, the wordline bias voltage Vb for the fast-erased cell is set to be higher than the wordline bias voltage Va for the slow-erased cell (Vb>Va). While the voltages applied to the wordlines are established in positive values, they may alternatively have negative values under the condition that the voltages for the fast-erased cells should be higher than the voltages for the slow-erased cells.

Figure 4B:
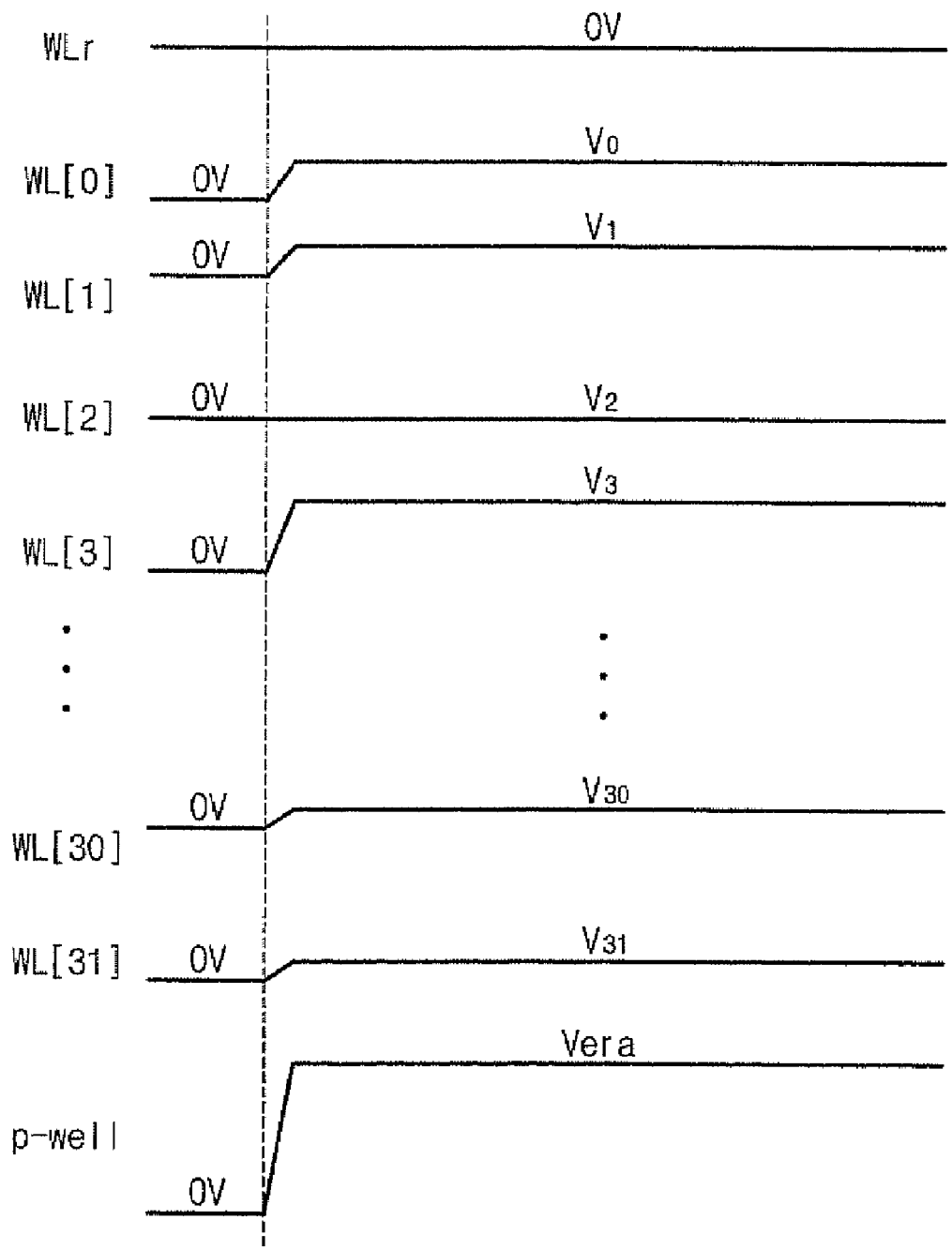
FIG. 4B is a timing diagram illustrating a wider distribution of voltage levels that may be applied to the wordlines of the flash memory device of FIG. 3.

FIG. 4B is a timing diagram illustrating the various levels of the wordline bias voltages that may be applied to the wordlines during an erasing operation, according to further embodiments of the present invention. Here, the wordline bias voltages $V_0 \sim V_{31}$ applied to respective of the wordlines may take on more than three discrete values. The greater the number of levels that the wordline bias voltages may take on, the narrower the post-erasing threshold-voltage distribution profile.

Figure 5:
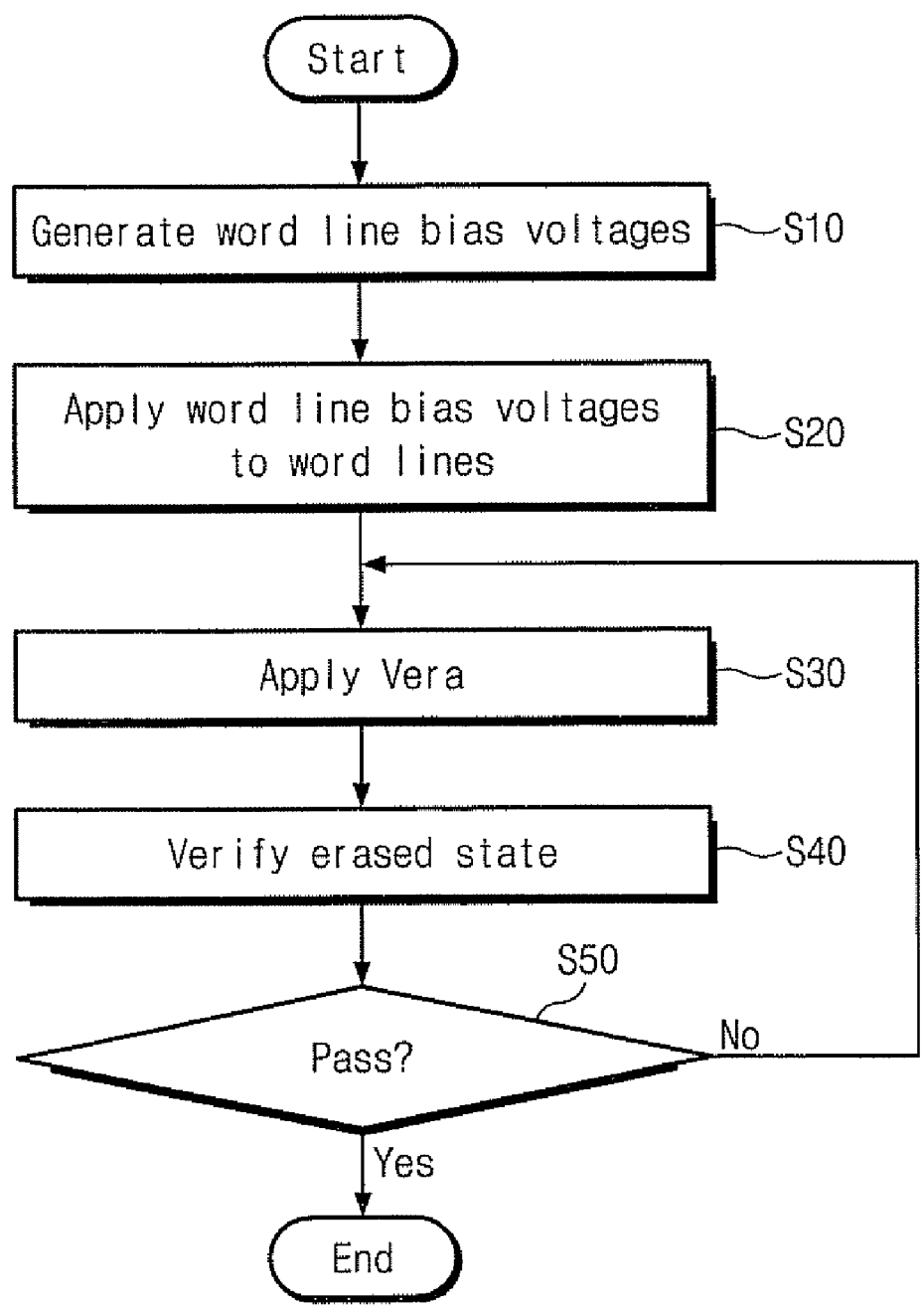
FIG. 5 is a flow chart illustrating an erasing method according to embodiments of the present invention.

FIG. 5 is a flow chart showing an erasing method for a flash memory device according to embodiments of the present invention. As shown at block S10 of FIG. 5, the voltage generator 200 outputs the wordline bias voltages $V_0 \sim V_{31}$ in response to the erasing command ERA. The levels of the wordline bias voltages $V_0 \sim V_{31}$ are established based on previously obtained data regarding the post-erasing threshold-voltage distribution profile and/or the erasing speed of the memory cells. Next, the X-decoder 210 applies the wordline bias voltages $V_0 \sim V_{31}$ to respective ones of the wordlines (block S20). Then, the erasing voltage $V_{era}$ is applied from the voltage generator 200 to the bulk region 40 of the memory block 220 that is to be erased (block S30). When the erasing voltage $V_{era}$ is applied to the bulk region 40, the memory cells of the memory block 220 are charged with a tunneling voltage $V_{tun}$ that is adjusted based on the different wordline bias voltages to account for differences in the erasing speeds of the memory cells. In particular, the memory cells having fast erasing speeds are more slowly erased, while the memory cells having the slow erasing speeds are more quickly erased by the increased tunneling voltage $V_{tun}$. Although FIG. 5 shows that the wordline bias voltages $V_0 \sim V_{31}$ and the erasing voltage $V_{era}$ are applied sequentially, in other embodiments of the present invention these voltages may be applied to the memory block 220 simultaneously.

After the erasing voltage $V_{era}$ is applied, an erasure-verifying operation may be conducted for finding a post-erasing distribution profile of threshold voltages (block S40). If this operation indicates that the distribution profile of threshold voltages insufficient to be narrower as such required (Fail), the aforementioned erasing operation is resumed (block S50). If instead the operation indicates that the distribution profile of threshold voltages is sufficient to be narrower (Pass), the erasing operation is terminated.

The erasing operations according to embodiments of the present invention may facilitate reducing and/or overcoming problems such as degradation of self-boosting efficiency due to a wider threshold-voltage distribution profile, and over-programmed results by a relatively fast programming speed while programming over-erased cells.

As described above, the erasing schemes according to embodiments of the present invention may narrow the threshold-voltage distribution profile due to under and over-erased memory cells, thereby increasing the stability of programming operations that occur subsequent to the erasing operation.

While example embodiments of the present invention have been illustrated and described, it will be understood by those skilled in the art that various other modifications may be made, and equivalents may be substituted, without departing from the true scope of the invention. Additionally, many modifications may be made to adapt a particular situation to the teachings of the present invention without departing from the central inventive concepts described herein. Therefore, it is intended that the present invention not be limited to the particular embodiments disclosed, but that the invention include all embodiments falling within the scope of the appended claims.

What is claimed is:

1. A method of erasing memory cells of a flash memory device having at least first and second wordlines, the method comprising:
    erasing memory cells that are connected to the first word line by applying a first electric field between a bulk region of the flash memory device and the first wordline; and
    erasing memory cells that are connected to the second word line by applying a second electric field, that is different from the first electric field, between the bulk region and the second wordline.

2. The method of claim 1, further comprising applying an erasing voltage to the bulk region.

3. The method of claim 2, wherein the first wordline is supplied with a first voltage and the second wordline is supplied with a second voltage that is different from the first voltage.

4. The method of claim 2, wherein the first electric field is induced from a voltage difference between the first wordline and the bulk region.

5. The method of claim 2, wherein the second electric field is induced from a voltage difference between the second wordline and the bulk region.

6. The method of claim 1, wherein the first and second electric fields are arranged to reduce differences of erasing speeds between memory cells connected to the first and second wordlines.

7. The method of claim 3, further comprising:
    obtaining data related to the erasing speeds of the memory cells; and
    selecting the first voltage and the second voltage based on the obtained data.

8. The method of claim 1, wherein the flash memory device includes an additional plurality of wordlines, wherein the method further comprises applying a third electric field between a bulk region of the flash memory device and at least one of the additional plurality of wordlines, and wherein the third electric field is different from both the first electric field and the second electric field.

9. The method of claim 3, wherein the first wordline is connected to memory cells having fast erasing speeds and the second wordline is connected to memory cells having slow erasing speeds, and wherein the first voltage is greater than the second voltage.

10. A method of erasing memory cells of a flash memory device, the method comprising:
    applying a first voltage to a bulk region of the flash memory device and applying a plurality of wordline voltages to respective of a plurality of wordlines of the flash memory device in order to erase the memory cells that are electrically connected to the plurality of wordlines; and then determining whether the memory cells are erased normally, wherein the plurality of wordline voltages include wordline voltages having at least two different voltage levels.

11. The method of claim 10, wherein the plurality of memory cells are erased through electric fields formed by voltage differences between the plurality of wordline voltages and the first voltage.

12. The method of claim 10, wherein the wordlines of the plurality of wordlines that are connected to memory cells having fast erasing speeds receive wordline voltages that are higher than the wordline voltages provided to the wordlines of the plurality of wordlines that are connected to memory cells with slow erasing speeds.

13. The method of claim 10, the method further comprising further erasing the plurality of memory cells if it is determined that the memory cells were not erased normally.

14. A method of erasing memory cells of a flash memory device having a plurality of wordlines, the method comprising:

generating a plurality of wordline bias voltages, wherein at least some of the wordline bias voltages are different than other of the wordline bias voltages;

applying the plurality of wordline bias voltages to respective ones of the plurality of wordlines and applying an erasing voltage to a bulk region of the flash memory device to erase the memory cells that are connected to each of the plurality of wordlines; and determining an erased state of the memory cells that are connected to each of the plurality of wordlines.

15. The method of claim 14, wherein the different wordline bias voltages are provided to reduce variability in the erasing speeds of the memory cells due to differences between coupling ratios of the memory cells during an erasing operation.

16. The method of claim 14, wherein the ones of the plurality of wordline bias voltages that are applied to memory cells having fast erasing speeds are higher than the ones of the plurality of wordline bias voltages that are applied to memory cells having slow erasing speeds.

17. The method of claim 14, wherein at least some of the plurality of wordline bias voltages comprise negative voltages.

18. The method of claim 14, further comprising continuing to apply the plurality of wordline bias voltages to respective ones of the plurality of wordlines and the erasing voltage to a bulk region of the flash memory device if it is determined that the memory cells are not fully erased.

19. A method of erasing a memory cell array of a flash memory device, the method comprising:

obtaining data relating to the erasing speeds of a plurality of memory cells in the memory cell array; and applying a plurality of wordline bias voltages to respective of a plurality of wordlines of the memory cell array during an erasing operation, wherein the applied wordline bias voltages are selected based at least in part on the obtained data.

20. The method of claim 19, wherein the obtained data comprises a post-erasing threshold voltage value for each memory cell of the memory cell array.

21. A memory device, comprising:

a memory cell array;

a plurality of wordlines coupled to the memory cell array; and a voltage generator that is configured to provide a plurality of wordline bias voltages to respective ones of the plurality of wordlines and to further provide an erasing voltage, wherein the plurality of wordline bias voltages include voltages having at least two different voltage levels, wherein the memory cell array is erased when the plurality of wordline bias voltages are applied to the respective ones of the plurality of wordlines and the erasing voltage is applied to a bulk region of the memory cell array, and wherein the voltage generator is configured to generate a wordline bias voltage that has a first voltage level for a first of the plurality of wordlines that is connected to memory cells having a first erasing speed and to generate a second wordline bias voltage that has a second voltage level, that is less than the first voltage level, for a second of the plurality of wordlines that is connected to memory cells having a second erasing speed that is slower than the first erasing speed.

22. The memory device of claim 21, further comprising a row decoder, and wherein the plurality of wordline bias voltages are provided to the respective ones of the plurality of wordlines via the row decoder.

23. A method of erasing a flash memory device having memory cells connected to word lines, the method comprising:

obtaining erasing speed data related to the word lines connected with the memory cells;

classifying the word lines into N groups based on the erasing speed data thus obtained (where N is a positive integer); and simultaneously applying different word line bias voltages to corresponding groups of word lines, respectively.

24. The method of claim 23, further comprising applying an erasing voltage to a bulk region where the memory cells are formed.

25. A semiconductor memory device comprising:

a memory cell array;

a plurality of word lines arranged on the memory cell array and divided into N groups; and a voltage generator circuit that is configured to generate different word line bias voltages to be supplied to respective corresponding groups of word lines during an erasing operation, wherein at least two of the groups of word lines are connected to memory cells that are to be erased as part of the erasing operation.

26. The semiconductor memory device of claim 25, wherein the voltage generator circuit is configured to generate an erasing voltage to be supplied to a bulk where memory cells of the memory cell array are formed.

27. A method of erasing memory cells of a flash memory device having at least first and second wordline groups, the method comprising:

erasing memory cells that are connected to the first wordline group by applying a first electric field between a bulk region of the flash memory device and the first wordline group; and erasing memory cells that are connected to the second wordline group by applying a second electric field, that is different from the first electric field, between the bulk region and the second wordline group.

28. The method of claim 27, further comprising applying an erasing voltage to the bulk region.

29. The method of claim 28, wherein the first wordline group is supplied with a first voltage and the second wordline group is supplied with a second voltage that is different from the first voltage.

30. The method of claim 28, wherein the first electric field is induced from a voltage difference between the first wordline group and the bulk region.

31. The method of claim 28, wherein the second electric field is induced from a voltage difference between the second wordline group and the bulk region.

32. The method of claim 27, wherein the first and second electric fields are arranged to reduce differences of erasing speeds between memory cells connected to the first and second wordline groups.

33. The method of claim 29, further comprising:
obtaining data related to the erasing speeds of the memory cells; and
selecting the first voltage and the second voltage based on the obtained data.

* * * * *